(12) United States Patent
Raman et al.

(10) Patent No.: US 9,070,632 B2
(45) Date of Patent: Jun. 30, 2015

(54) AQUEOUS POLISHING COMPOSITION AND PROCESS FOR CHEMICALLY MECHANICALLY POLISHING SUBSTRATES HAVING PATTERNED OR UNPATTERNED LOW-K DIELECTRIC LAYERS

(75) Inventors: Vijay Immanuel Raman, Mannheim (DE); Frank Rittig, Worms (DE); Yuzhuo Li, Mannheim (DE); Wei Lan William Chiu, Taipei (TW)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/878,361

(22) PCT Filed: Oct. 4, 2011

(86) PCT No.: PCT/IB2011/054344
§ 371 (c)(1),
(2), (4) Date: May 28, 2013

(87) PCT Pub. No.: WO2012/046179
PCT Pub. Date: Apr. 12, 2012

(65) Prior Publication Data
US 2013/0273739 A1    Oct. 17, 2013

Related U.S. Application Data

(60) Provisional application No. 61/390,639, filed on Oct. 7, 2010.

(30) Foreign Application Priority Data

Oct. 7, 2010 (EP) .................................... 10186886

(51) Int. Cl.
| | | |
|---|---|---|
| *B24D 3/02* | (2006.01) | |
| *C09C 1/68* | (2006.01) | |
| *C09K 3/14* | (2006.01) | |
| *H01L 21/306* | (2006.01) | |
| *C09G 1/04* | (2006.01) | |
| *G09G 1/02* | (2006.01) | |
| *H01L 21/3105* | (2006.01) | |
| *H01L 21/321* | (2006.01) | |
| *H01L 21/768* | (2006.01) | |

(52) U.S. Cl.
CPC ....... *H01L 21/30625* (2013.01); *H01L 21/7684* (2013.01); *C09G 1/04* (2013.01); *G09G 1/02* (2013.01); *H01L 21/31053* (2013.01); *H01L 21/3212* (2013.01)

(58) Field of Classification Search
CPC ...... C09G 1/02; C09G 1/04; H01L 21/30625; H01L 21/3212; H01L 21/7684
See application file for complete search history.

(56) References Cited

U.S. PATENT DOCUMENTS

| | | |
|---|---|---|
| 5,057,560 A | 10/1991 | Mueller |
| 5,770,528 A | 6/1998 | Mumick et al. |
| 6,068,787 A | 5/2000 | Grumbine et al. |
| 6,645,051 B2 | 11/2003 | Sugiyama et al. |
| 6,682,642 B2 | 1/2004 | Mikkola et al. |
| 7,153,335 B2 | 12/2006 | Siddiqui et al. |
| 7,250,391 B2 | 7/2007 | Kanno et al. |
| 7,300,601 B2 | 11/2007 | Liu et al. |
| 7,361,603 B2 | 4/2008 | Liu et al. |
| 2002/0198328 A1 | 12/2002 | L'Alloret |
| 2003/0228762 A1 | 12/2003 | Moeggenborg et al. |
| 2004/0209095 A1 | 10/2004 | Manias et al. |
| 2004/0217009 A1 | 11/2004 | Mikkola et al. |
| 2005/0014667 A1 | 1/2005 | Aoyama et al. |
| 2005/0176259 A1 | 8/2005 | Yokoi et al. |
| 2005/0266683 A1 | 12/2005 | Lee |
| 2006/0141254 A1 | 6/2006 | Kramer et al. |
| 2007/0029198 A1 | 2/2007 | Kooi |

(Continued)

FOREIGN PATENT DOCUMENTS

| | | |
|---|---|---|
| DE | 26 10 705 | 9/1977 |
| EP | 0 583 814 | 2/1994 |

(Continued)

OTHER PUBLICATIONS

Schmaljohann, D., "Thermo- and pH-responsive polymers in drug delivery," Elsevier, Advanced Drug Delivery Reviews, vol. 58, pp. 1655 to 1670, (2006).
Mori, H. et al., "Controlled synthesis of thermoresponsive polymers derived from L-proline via RAFT polymerization," Chem. Commun., The Royal Society of Chemistry, pp. 4872 to 4874, (2005).
International Search Report Issued Jan. 19, 2012 in PCT/IB11/54344 Filed Oct. 4, 2011.

(Continued)

*Primary Examiner* — Duy Deo
(74) *Attorney, Agent, or Firm* — Oblon, McClelland, Maier & Neustadt, L.L.P.

(57) ABSTRACT

An aqueous polishing composition comprising (A) abrasive particles and (B) an amphiphilic nonionic surfactant selected from the group consisting of water-soluble or water-dispersible surfactants having (b1) hydrophobic groups selected from the group consisting of branched alkyl groups having 10 to 18 carbon atoms; and (b2) hydrophilic groups selected from the group consisting of polyoxyalkylene groups comprising (b21) oxyethylene monomer units and (b22) substituted oxyalkylene monomer units wherein the substituents are selected from the group consisting of alkyl, cycloalkyl, or aryl, alkyl-cycloalkyl, alkyl-aryl, cycloalkyl-aryl and alkyl-cycloalkyl-aryl groups, the said polyoxyalkylene group containing the monomer units (b21) and (b22) in random, alternating, gradient and/or blocklike distribution; a CMP process for substrates having patterned or unpatterned low-k or ultra-low-k dielectric layers making use of the said aqueous polishing composition; and the use of the said aqueous polishing composition for manufacturing electrical, mechanical and optical devices.

14 Claims, No Drawings

(56) References Cited

U.S. PATENT DOCUMENTS

| | | |
|---|---|---|
| 2007/0289875 A1 | 12/2007 | Paneccasio et al. |
| 2008/0050435 A1 | 2/2008 | Hennink et al. |
| 2008/0105652 A1* | 5/2008 | Brusic et al. ............ 216/89 |
| 2008/0111101 A1* | 5/2008 | Keleher et al. ............ 252/79.1 |
| 2008/0124913 A1 | 5/2008 | Choi et al. |
| 2008/0149884 A1 | 6/2008 | Siddiqui et al. |
| 2008/0249210 A1 | 10/2008 | Entenmann et al. |
| 2008/0254628 A1 | 10/2008 | Boggs et al. |
| 2008/0280452 A1 | 11/2008 | Yokoi et al. |
| 2009/0013609 A1 | 1/2009 | Gupta et al. |
| 2009/0311864 A1 | 12/2009 | Yamada et al. |
| 2010/0029181 A1* | 2/2010 | De Rege Thesauro et al. . 451/37 |
| 2011/0260101 A1 | 10/2011 | Rittig et al. |
| 2012/0208344 A1 | 8/2012 | Lauter et al. |
| 2012/0322264 A1 | 12/2012 | Raman et al. |
| 2013/0005149 A1 | 1/2013 | Li et al. |
| 2013/0161285 A1 | 6/2013 | Li et al. |
| 2013/0168348 A1 | 7/2013 | Li et al. |
| 2013/0171824 A1 | 7/2013 | Li et al. |

FOREIGN PATENT DOCUMENTS

| | | |
|---|---|---|
| EP | 1 036 836 | 9/2000 |
| EP | 1 150 341 | 10/2001 |
| EP | 1 197 587 | 4/2002 |
| EP | 1 306 415 | 5/2003 |
| EP | 1 534 795 | 7/2006 |
| EP | 1 936 674 | 6/2008 |
| EP | 1 942 179 | 7/2008 |
| WO | 01 60926 | 8/2001 |
| WO | 2004 029160 | 4/2004 |
| WO | 2004 052946 | 6/2004 |
| WO | 2004 063301 | 7/2004 |
| WO | 2005 014753 | 2/2005 |
| WO | 2006 093242 | 9/2006 |
| WO | 2007 012763 | 2/2007 |
| WO | 2011 003904 | 1/2011 |
| WO | 2012 032461 | 3/2012 |

OTHER PUBLICATIONS

U.S. Appl. No. 13/820,765, filed Apr. 25, 2013, Li, et al.
U.S. Appl. No. 14/356,530, filed May 6, 2014, Seyffer, et al.

* cited by examiner

AQUEOUS POLISHING COMPOSITION AND PROCESS FOR CHEMICALLY MECHANICALLY POLISHING SUBSTRATES HAVING PATTERNED OR UNPATTERNED LOW-K DIELECTRIC LAYERS

This application is a National Stage of PCT/IB11/054344 filed Oct. 4, 2011 and claims the benefit of U.S. 61/390,639 filed Oct. 7, 2010 and EP 10 186 886.7 filed Oct. 7, 2010.

The present invention is directed to a novel aqueous polishing composition which is particularly suitable for polishing substrates having patterned or unpatterned low-k or ultra-low-k dielectric layers.

Moreover, the present invention is directed to a novel process for chemically mechanically polishing substrates having patterned or unpatterned low-k or ultra-low-k dielectric layers.

CITED DOCUMENTS

The documents cited in the present application are incorporated by reference in their entirety.

BACKGROUND OF THE INVENTION

Chemical mechanical planarization or polishing (CMP) is the primary process to achieve local and global planarity of integrated circuit (IC) devices. The technique typically applies CMP compositions or slurries containing abrasives and other additives as an active chemistry between a rotating substrate surface and a polishing pad under an applied load. Thus, the CMP process couples a physical process such as abrasion with a chemical process such as oxidation or chelation. It is not desirable for the removal or polishing of substrate materials to be comprised of purely physical or purely chemical action, but rather the synergistic combination of both in order to achieve a fast uniform removal.

This way, the substrate material is removed until the desired planarity is achieved or a barrier sublayer or stopping layer is exposed. Ultimately, a planar, defect-free surface is obtained which enables proper multilayer IC device fabrication by subsequent photolithography, patterning, etching and thin-film processing.

The progressive decrease in feature size of the circuit components in integrated circuit (IC) devices having large-scale integration (LSI) or very large-scale integration (VLSI) has tremendously increased the need for global surface planarization of the various thin film layers that constitute the ICs by CMP. Typically, CMP involves the removal of thin films of materials such as copper which is used for the electrically conductive wiring,
tantalum nitride, tantalum/tantalum nitride or titanium which are used as diffusion barrier to prevent the diffusion of copper into the dielectric material, and
silicon dioxide is used as the insulating dielectric material between the conductive wirings.

It is therefore necessary to be able to polish different layers at a desired rate to obtain the desired defect free surface as described for example in the American patent applications US 2005/0076578 A1 (U.S. Pat. No. 7,153,335 B2) and US 2009/0311864 A1. Therefore, a typical CMP slurry used for barrier CMP entails different components to enhance and suppress the removal rates (MRR) to achieve the desired selectivity requirements.

Thus, tantalum nitride MRR can be modulated by an oxidizing agent such as hydrogen peroxide and a tantalum nitride enhancer such as malonic acid which is a film forming agent interrupting the tantalum oxide formation.

The MRR of silicon dioxide, in particular TEOS, can be suppressed by polyols which are selectively absorbed on the hydroxyl group rich surfaces.

The MRR of copper can be modulated by the combined use of an enhancer such as L-histidine and a passivating agent such as benzenetriazole (BTA).

CMP slurries for silicon-based inter-metal dielectric layers have been particularly well developed in the semiconductor industry, and the chemical and mechanical nature of polishing and wear of the silicon-based dielectrics is reasonably well understood. However, one problem with a silicon-based dielectric materials is that their dielectric constant is relatively high, being approximately 3.9 or higher, depending on factors such residual moisture content. As a result, the capacitance between the conductive layers is also relatively high, which in turn limits the speed or frequency at which the IC can operate. The strategies which have been developed to reduce the capacitance include (1) incorporating metals with lower resistivity values (e.g., copper), and (2) providing electrical isolation with insulating materials having lower dielectric constants than silicon dioxide, i.e., low-k and ultra-low-k dielectric materials.

Such low-k and ultra-low-k dielectric materials include organic polymeric materials, inorganic and organic porous dielectric materials, and blended or composite organic and inorganic materials, which can be porous or non-porous, as for example, carbon-doped silicon dioxide materials. It would be highly desirable to incorporate such low-k and ultra-low-k dielectric materials into the IC structures whilst still being able to utilize the conventional CMP slurries for polishing the surface of the dielectric materials during the semiconductor wafer processing. In particular, it would be highly desirable to achieve a high selectivity of silicon dioxide, in particular TEOS, over low-k and ultra-low-k materials such as carbon-doped silicon dioxide materials. Such a high selectivity is very important to maintain ultra-low-k integrity, in particular for the 45 nm node and below and for new complementary metal-oxide semiconductor (CMOS) generations.

The US patent application US 2003/0228762 A1 discloses a CMP slurry for polishing substrates containing a low-k dielectric layer, the said CMP slurry containing abrasive particles selected from the group consisting of alumina, silica, titania, ceria, zirconia, germania, magnesia, and co-formed products thereof; and
amphiphilic nonionic surfactants having at least one hydrophobic head group and at least one hydrophilic tail group.

According to the US 2003/0228762 A1, suitable head groups include polysiloxanes, tetra-$C_{1-4}$-alkyldecynes, saturated or partially unsaturated $C_{6-30}$ alkyl groups, polyoxypropylene groups, $C_{6-12}$ alkyl phenyl or alkyl cyclohexyl groups, and polyethylene groups. Suitable tail groups include polyoxyethylene groups. Thus, the amphiphilic anionic surfactant can be selected from the group consisting of polyoxyethylene alkyl ethers or esters. However, according to the examples of the US 2003/0228762 A1, the drop in the low-k dielectric MRR caused by the disclosed amphiphilic nonionic surfactants does not exceed 75%, and the tantalum nitride over low-k dielectric selectivity and the PETEOS over low-k dielectric selectivity do not exceed 3.

The European patent application EP 1 150 341 A1 discloses a CMP slurry for polishing metal layers containing nonionic polyoxyethylene-polyoxypropylene alkyl ether surfactants. However, neither the number of carbon atoms in the alkyl group nor the distribution of the oxyethylene and oxypropylene monomer units are specified accurately. Moreover, the European patent application remains silent about the CMP of low-k and ultra-low-k materials with CMP slurries containing such surfactants.

The American patent application US 2008/0124913 A1 discloses CMP slurry containing nonionic polyoxyethylene-polyoxypropylene alkyl ether surfactants of the general formula:

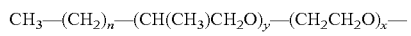

$$CH_3-(CH_2)_n-(CH(CH_3)CH_2O)_y-(CH_2CH_2O)_x-$$

wherein the indices have the following meaning: n=3-22, y=1-30, and x=1-30 with x+y preferably at least 5, as polysilicon suppressors.

The American patent U.S. Pat. No. 6,645,051 B2 discloses a CMP slurry for polishing a memory hard disk substrate, the said CMP slurry comprising a polyoxyethylene-polyoxypropylene alkyl ether surfactant. However, neither the number of carbon atoms in the alkyl group nor the distribution of the oxyethylene and oxypropylene monomer units are specified accurately. Moreover, the American patent remains silent about the CMP of low-k and ultra-low-k materials with CMP slurries containing such surfactants.

OBJECTS OF THE INVENTION

It was an object of the present invention to provide a novel aqueous polishing composition, in particular a CMP slurry, which is excellently suited for chemically mechanically polishing substrates, in particular semiconductor wafers, having patterned or unpatterned low-k or ultra-low-k dielectric layers with a dielectric constant of 3.5 or less.

Most particularly, the novel aqueous polishing composition should be excellently suited for the barrier CMP of substrate materials having other materials than the low-k and ultra-low-k dielectric layers present, as for example, metal layers, barrier layers and silicon dioxide layers.

The novel aqueous polishing composition, in particular the novel CMP slurry, should preferably remove silicon dioxide layers and maintain the integrity of the low-k and ultra-low-k materials, i.e., it should have a particularly high selectivity of silicon dioxide over low-k and ultra-low-k materials with regard to the MRRs. Preferably, the novel CMP slurry should not affect the MRRs of metal layers and barrier layers when present. Particularly, as far as metal layers, barrier layers and silicon dioxide layers are present in the substrate to be polished, the novel aqueous polishing composition should show the combination of as many as possible of the following properties: (a) high MRR of metal layer, (b) high MRR of barrier layer, (c) high MRR of silicon dioxide, (d) high selectivity of silicon dioxide over low-k and ultra-low-k materials with regard to MRR, (e) high selectivity of metal layer over low-k and ultra-low-k materials with regard to MRR, and (f) high selectivity of barrier layer over low-k and ultra-low-k materials with regard to MRR. Most particularly, as far as copper layers, tantalum nitride layers and silicon dioxide layers are present in the substrate to be polished, the novel aqueous polishing composition should show the combination of as many as possible of the following properties: (a') high MRR of copper, (b') high MRR of tantalum nitride, (c') high MRR of silicon dioxide, (d') high selectivity of silicon dioxide over low-k and ultra-low-k materials with regard to MRR, (e') high selectivity of copper over low-k and ultra-low-k materials with regard to MRR, and (f') high selectivity of tantalum nitride over low-k and ultra-low-k materials with regard to MRR.

Furthermore, it was an object of the present invention to provide a novel process for chemically mechanically polishing substrates, in particular semiconductor wafers, having patterned and unpatterned low-k or ultra-low-k dielectric layers with a dielectric constant of 3.5 or less.

Most particularly, the novel process should be excellently suited for the barrier CMP of substrate materials having other materials than the low-k and ultra-low-k dielectric layers present, as for example, metal layers, barrier layers and silicon dioxide layers.

The novel process should preferably remove silicon dioxide layers and maintain the integrity of the low-k and ultra-low-k materials, i.e., it should have a particularly high selectivity of silicon dioxide over low-k and ultra-low-k materials with regard to the MRRs. Preferably, the novel process should not affect the MRRs of metal layers and barrier layers when present.

SUMMARY OF THE INVENTION

Accordingly, the novel aqueous polishing composition has been found, the said composition comprising
(A) at least one type of abrasive particles and
(B) at least one amphiphilic nonionic surfactant selected from the group consisting of water-soluble or water-dispersible surfactants having
(b1) at least one hydrophobic group selected from the group consisting of branched alkyl groups having 5 to 20 carbon atoms; and
(b2) at least one hydrophilic group selected from the group consisting of polyoxyalkylene groups comprising
(b21) oxyethylene monomer units and
(b22) at least one type of substituted oxyalkylene monomer units wherein the substituents are selected from the group consisting of alkyl, cycloalkyl, or aryl, alkyl-cycloalkyl, alkyl-aryl, cycloalkyl-aryl and alkyl-cycloalkyl-aryl groups;
the said polyoxyalkylene group containing the monomer units (b21) and (b22) in random, alternating, gradient and/or blocklike distribution.

Hereinafter, the novel aqueous polishing composition is referred to as the "composition of the invention".

Moreover, the novel process for chemically mechanically polishing substrates having patterned or unpatterned low-k dielectric or ultra-low-k layers having a dielectric constant of 3.5 or less has been found, the said process comprising the steps of
(1) contacting the substrate material at least once with an aqueous polishing composition comprising
(A) at least one type of abrasive particles and
(Ba) at least one amphiphilic nonionic surfactant selected from the group consisting of water-soluble or water-dispersible surfactants having
(b1a) at least one hydrophobic group selected from the group consisting of linear alkyl groups having 5 to 20 carbon atoms and branched alkyl groups (b1); and
(b2) at least one hydrophilic group selected from the group consisting of polyoxyalkylene groups comprising
(b21) oxyethylene monomer units and
(b22) at least one type of substituted oxyalkylene monomer units wherein the substituents are selected from the group consisting of alkyl, cycloalkyl, or aryl, alkyl-cycloalkyl, alkyl-aryl, cycloalkyl-aryl and alkyl-cycloalkyl-aryl groups;

the said polyoxyalkylene group containing the monomer units (b21) and (b22) in random, alternating, gradient and/or blocklike distribution;

(2) chemically mechanically polishing the substrate for a time and at a temperature until the desired global planarity is achieved; and (3) removing the substrate from the contact with the aqueous polishing composition of the invention.

Hereinafter, the novel process for chemically and mechanically polishing substrates having patterned and unpatterned low-k and ultra-low-k dielectric layers having a dielectric constant of 3.5 or less is referred to as the "process of the invention".

Last but not least, the novel use of the composition of the invention for manufacturing electrical, mechanical and optical devices has been found, which use is hereinafter referred to as the "use of the invention".

ADVANTAGES OF THE INVENTION

In view of the prior art, it was surprising and could not be expected by the skilled artisan that the objects of the present invention could be solved by the composition, the process and the use of the invention.

It was particularly surprising that the composition of the invention was excellently suited for chemically mechanically polishing substrates, in particular semiconductor wafers, having patterned or unpatterned low-k or ultra-low-k dielectric layers with a dielectric constant of 3.5 or less.

It was most particularly surprising that the composition of the invention was excellently suited for the barrier CMP of substrate materials having other materials than the low-k and ultra-low-k dielectric layers present, as for example, metal layers, barrier layers and silicon dioxide layers.

Surprisingly so, the composition of the invention was also excellently suited for the use of the invention, i.e., the manufacture of electric, mechanical and optical devices wherein high precision polishing steps were required.

In the process of the invention, the composition of the invention preferably removed silicon dioxide layers and maintained the integrity of the low-k and ultra-low-k layers, i.e., it had a particularly high selectivity of silicon dioxide over low-k and ultra-low-k materials with regard to the MRRs. Preferably, the composition of the invention did not affect the MRRs of metal layers and barrier layers when present.

Furthermore, the process of the invention was most excellently suited for chemically mechanically polishing substrates, in particular semiconductor wafers, having patterned or unpatterned low-k or ultra-low-k dielectric layers with a dielectric constant of 3.5 or less.

Most particularly, the process of the invention was most excellently suited for the barrier CMP of substrates having other materials than the low-k and ultra-low-k dielectric layers present, as for example, metal layers, barrier layers and silicon dioxide layers.

The process of invention preferably removed silicon dioxide layers and maintained the integrity of the low-k and ultra-low-k materials, i.e., it had a particularly high selectivity of silicon dioxide over low-k and ultra-low-k materials with regard to the MRRs. Preferably, the composition of the invention did not affect the MRRs of metal layers and barrier layers when present.

DETAILED DESCRIPTION OF THE INVENTION

The composition of the invention is an aqueous composition. This means that it contains water, in particular ultrapure water, as the main solvent and dispersing agent. Nevertheless, the composition of the invention may contain at least one water-miscible organic solvent, however, only in such minor amounts that they do not change the aqueous nature of the composition of the invention.

Preferably, the composition of the invention contains water in amounts of from 60 to 99.95% by weight, more preferably 70 to 99.9% by weight, even more preferably 80 to 99.9% by weight and, most preferably, 90 to 99.9% by weight, the weight percentages being based on the complete weight of the composition of the invention.

"Water-soluble" means that the relevant component or ingredient of the composition of the invention can be dissolved in the aqueous phase on the molecular level.

"Water-dispersible" means that the relevant component or ingredient of the composition of the invention can be dispersed in the aqueous phase and forms a stable emulsion or suspension.

"Oligomer" or "oligomeric" means that the relevant component of the composition of the invention and the alkylene oxide of the surfactant (B) group consist of 3 to 10 linked monomeric structural units.

"Polymer" or "polymeric" means that the relevant component of the composition of the invention and of the alkylene oxide group of the surfactant (B) consist of more than 10 linked monomeric structural units.

The first essential ingredient of the composition of the invention is at least one, preferably one, type of abrasive particles (A).

The average particle size of the abrasive particles (A) can vary broadly and, therefore, can be adjusted most advantageously to the particular requirements of a given composition and process of the invention. Preferably, the average particle size as determined by dynamic laser light scattering is in the range of from 1 to 2000 nm, preferably 1 to 1000 nm, more preferably 1 to 750, and, most preferably, 1 to 500 nm. The primary particles can also be aggregated forming secondary aggregates.

The particle size distribution of the abrasive particles (A) can be monomodal, bimodal or multimodal. Preferably, the particle size distribution is monomodal in order to have an easily reproducible property profile of the abrasive particles (A) and easily reproducible conditions during the process of the invention.

Moreover, the particle size distribution of the abrasive particles (A) can be narrow or broad. Preferably, the particle size distribution is narrow with only small amounts of small particles and large particles in order to have an easily reproducible property profile of the abrasive particles (A) and easily reproducible conditions during the process of the invention.

The abrasive particles (A) can have various shapes. Thus, they may be of one or essentially one type of shape. However, it also possible that the abrasive particles (A) have different shapes. In particular, two types of differently shaped abrasive particles (A) may be present in a given composition of the invention. As regards the shapes themselves, they can be cubes, cubes with chamfered edges, octahedrons, icosahedrons, nodules and spheres with or without protrusions or indentations. Most preferably, the shape is spherical with no or only very few protrusions or indentations. This shape, as a rule, is preferred because it usually increase is the resistance to the mechanical forces the abrasive particles (A) are exposed to it during a CMP process.

In principle, any type of abrasive particles (A) can be used in the composition of the invention as long as they possess the above described property profile. Thus, the abrasive particles (A) may be organic or inorganic particles or organic-inorganic hybrid particles. Preferably, the abrasive particles (A) are inorganic particles.

More preferably, the inorganic abrasive particles (A) are selected from the group consisting of alumina, silica, titania, ceria, zirconia, germania, magnesia, co-formed products thereof, and mixtures thereof. Most preferably, silica is used as the abrasive particles (A).

The amount of the abrasive particles (A) used in the composition of the invention can vary broadly and, therefore, can be adjusted most advantageously to the particular requirements of a given composition and process of the invention. Preferably, the composition of the invention contains 0.005 to 10% by weight, more preferably 0.01 to 8% by weight and, most preferably 0.01 to 6% by weight of the abrasive particles (A), the weight percentages being based on the complete weight of the composition of the invention.

The second essential ingredient of the composition of the invention is at least one, preferably one, water-soluble or water-dispersible, preferably water-soluble, amphiphilic nonionic surfactant (B).

The amphiphilic nonionic surfactant (B) comprises at least one hydrophobic group (b1). This means that the amphiphilic nonionic surfactant (B) can have more than one hydrophobic groups (b1), e.g., 2, 3 or more groups (b1), which are separated from each other by at least one hydrophilic group (b2) hereinbelow described.

The hydrophobic group (b1) is selected from the group consisting of branched alkyl groups having 5 to 20, preferably 7 to 16 and, most preferably 8 to 15 carbon atoms.

Preferably, the branched alkyl groups (b1) have on the average a degree of branching of from 1 to 5, preferably 1 to 4 and, most preferably, 1 to 3.

Suitable branched alkyl groups (b1) are derived from isopentane, neopentane and the branched hexane, heptane, octane, nonane, decane, undecane, dodecane, tridecane, tetradecane, pentadecane, hexadecane, heptadecane, nonadecane and eicosane isomers, The amphiphilic nonionic surfactant (B) comprises at least one hydrophilic group (b2). This means that the amphiphilic nonionic surfactant (B) contains more than one groups (b2), e.g., 2, 3 or more groups (b2) which are separated from each other by hydrophobic groups (b1).

Therefore, the amphiphilic nonionic surfactant (B) can have different blocklike general structures. Examples of such general blocklike structures are:

b1-b2,
b1-b2-b1,
b2-b1-b2,
b2-b1-b2-b1,
b1-b2-b1-b2-b1, and
b2-b1-b2-b1-b2.

The hydrophilic group (b2) is selected from the group consisting of polyoxyalkylene groups which can be oligomeric or polymeric.

The hydrophilic group (b2) comprises oxyethylene monomer units (b21).

Moreover, the hydrophilic group (b2) comprises at least one type of substituted oxyalkylene monomer units (b22), wherein the substituents are selected from the group consisting of alkyl, cycloalkyl and aryl groups.

Preferably, the oxyalkylene monomer units (b22) are derived from substituted oxiranes wherein the substituents are selected from the group consisting of alkyl groups, cycloalkyl groups and aryl groups.

The substituents themselves can also carry inert substituents, i.e., substituents which do not adversely affect the copolymerization of the oxiranes and the surface activity of the amphiphilic nonionic surfactants (B). Examples of such inert substituents are fluorine and chlorine atoms, nitro groups and nitrile groups. Been there at substitutions are used in such amounts that they do not adversely affect the hydrophilic-hydrophobic balance of the surfactant (type B). Preferably, the substituents do not carry such inert substituents.

The substituents of the oxiranes are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-aryl group 11 to 20 carbon atoms, and alkyl-cycloalkyl-aryl groups having 12 to 30 carbon atoms.

Examples of suitable alkyl groups are methyl, ethyl, propyl, isopropyl, n-butyl, sec-butyl, tert-butyl, n-pentyl, 2- and 3-methylpentyl, 2,2-dimethylpropyl, n-hexyl, 2-, 3- and 4-methylpentyl, 2,2- and 3,3-dimethylbutyl, n-heptyl, 2,3-dimethylpentyl, 2,3,3-trimethylbutyl, n-octyl, iso-octyl, 2-ethylhexyl, n-nonyl, 2-ethyl-3,4-dimethylpentyl, and n-decyl; preferably, methyl, ethyl, propyl, isopropyl, n-butyl, n-pentyl, and n-hexyl.

Examples of suitable cycloalkyl groups are cyclopentyl, cyclohexyl, cyclopentane-1,1-diyl, cyclopentane-1,2-diyl, cyclohexane-1,1-diyl, and cyclohexane-1,2-diyl.

Examples of suitable aryl groups are phenyl and 1- and 2-naphthyl.

Examples of suitable alkyl-cycloalkyl groups are cyclopentyl- and cyclohexylmethyl 2-cyclopentyl- and 2-cyclohexylethy-1-yl, 3-cyclopentyl- and 3-cyclohexylprop-1-yl, and 4-cyclopentyl- and 4-cyclohexyl-n-but-1-yl.

Examples of suitable alkyl-aryl groups are phenylmethyl, 2-phenyleth-1-yl, 3-phenylprop-1-yl, and 4-phenyl-n-but-1-yl.

Examples of suitable cycloalkyl-aryl groups are 4-phenyl-cyclohex-1-yl, 4-cyclohexyl-phen-1-yl, and 2,3-dihydroindene-1,2-diyl.

Examples of suitable alkyl-cycloalkyl-aryl groups are cyclohexyl-phenyl-methyl and 2-cyclohexyl-2-phenyl-eth-1-yl.

Examples for particularly preferred substituted oxiranes are methyl, ethyl, 2,2- and 2,3-dimethyl, 2,2,3-trimethyl, 2,2,3,3-tetramethyl, 2-methyl-3-ethyl, 2,2 and 2,3-diethyl, n-propyl, 2-methyl-3-n-propyl, n-butyl, n-pentyl, n-hexyl, n-heptyl, n-octyl, n-nonyl, n-decyl, cyclopentyl, cyclohexyl, phenyl, and naphthyl oxirane; 1,2-epoxy-cyclohexane and -cyclopentane; 1-oxa-3-spiro[3.4]-heptane 1-oxa-3-spiro[3.5]-octane; and 1,2-epoxy-2,3-dihydroindene.

Methyl oxirane (propyleneoxide) and ethyl oxirane (butylene oxide) are most particularly preferably used.

Preferably, the hydrophilic group (b2) consists of the monomer units (b21) and (b22).

The polyoxyalkylene group contains the monomer units (b21) and (b22) in random, alternating, gradient and/or blocklike distribution. This means, that one hydrophilic group (b2) can have only one type of distribution, i.e., random: . . . -b21-b21-b22-b21-b22-b22-b21-b22- . . . ;
alternating: . . . -b21-b22-b21-b22-b21- . . . ;

gradient: . . . b21-b21-b21-b22-b21-b21-b22-b22-b21-b22-b22-b22- . . . ; or blocklike: . . . -b21-b21-b21-b21-b22-b22-b22-b22- . . . .

Or the hydrophilic group (b2) can contain at least two types of distributions, e.g., an oligomeric or polymeric segment having a random distribution and an oligomeric or polymeric segment having alternating distribution.

Preferably, the hydrophilic group (b2) has only one type of distribution. Most preferably, the distribution is random or blocklike.

The molar ratio of oxyethylene monomer units (b21) to oxyalkylene monomer units (b22) can vary broadly and, therefore, can be adjusted most advantageously to the particular requirements of the composition, the process and the use of the invention. Preferably the molar ratio (b21):(b22) is from 100:1 to 1:1, more preferably, from 60:1 to 1.5:1 and, most preferably, from 50:1 to 1.5:1.

Also the degree of polymerization of the oligomeric and polymeric polyoxyalkylene groups (b2) can vary broadly and, therefore, can be adjusted most advantageously to the particular requirements of the composition, the process and the use of the invention. Preferably, the degree of polymerization is in the range of from 5 to 100, preferably 5 to 90, and most preferably, 5 to 80.

The amphiphilic nonionic surfactants (B) are customary and known materials and are commercially available from BASF SE under the trademark Plurafac™.

The concentration of the amphiphilic nonionic surfactants (B) in the composition of the invention can vary broadly, and, therefore, can be adjusted most advantageously to the particular requirements of the composition, the process of the use of the invention. Preferably, the concentration is in the range of 1 ppm to 0.1%, more preferably 10 ppm 0.09% by weight, even more preferably 100 ppm to 0.08% by weight and, most preferably, 200 ppm to 0.08% by weight, the weight specifications being based on the complete weight of the composition of the invention.

The composition of the invention can furthermore contain at least one functional component (C) which is different from the components (A) and (B). Preferably, at least two functional components (C) are used.

More preferably, the functional components (C) are selected from the group consisting of amphiphilic nonionic surfactants other than the surfactants (B), polyhydric alcohols with at least two hydroxy groups, materials having a lower critical solution temperature LCST or an upper critical solution temperature UCST, oxidizing agents, passivating agents, charge reversal agents, complexing or chelating agents, frictive agents, stabilizing agents, pH-adjusting agents, tantalum nitride enhancers, buffering agents, rheology agents, surfactants, metal cations and organic solvents.

Examples of suitable amphiphilic nonionic surfactants (C) are described in, for example, the European patent EP 1 534 795 B1, page 3, paragraph [0013] to page 4, paragraph [0023].

Suitable polyhydric alcohols (C) are diols such as ethylene glycol and propylene glycol, triols such as glycerol, pentaerythritol, alditols, cyclitols and dimers and oligomers of glycerol, trimethylolpropane, pentaerythritol, alditols and cyclitols.

Suitable oxidizing agents (C) and their effective amounts are known, for example, from the European patent application EP 1 036 836 A1, page 8, paragraphs [0074] and [0075] or from the American patents U.S. Pat. No. 6,068,787, column 4, line 40 to column 7, line 45 or U.S. Pat. No. 7,300,601 B2, column 4, lines 18 to 34. Preferably, organic and inorganic peroxides, more preferably inorganic peroxides, are used. In particular, hydrogen peroxide is used.

Suitable passivating agents (C), which also referred to as corrosion inhibitors, and their effective amounts are known, for example, from the American patent U.S. Pat. No. 7,300,601 B2, column 3, line 59 to column 4, line 9, from the American patent application US 2008/0254628 A1, the paragraph [0058] bridging the pages 4 and 5 or from the European patent EP 1 534 795 B1, page 5, paragraph [0031].

Suitable complexing or chelating agents (C), which are sometimes also designated as frictive agents (cf. the American patent application US 2008/0254628 A1, page 5, paragraph [0061]) or etching agents or etchants (cf. the American patent application US 2008/0254628 A1, page 4, paragraph [0054]), and their effective amounts are known, for example, from the American patent U.S. Pat. No. 7,300,601 B2, column 4, lines with 35 to 48 or from the European patent EP 1 534 795 B1, page 5, paragraph [0029]. The amino acids, in particular glycine and L-histidine, and carboxylic acids such as malonic acid are most particularly preferably used.

Suitable stabilizing agents (C) and their effective amounts are known, for example, from the American patent U.S. Pat. No. 6,068,787, column 8, lines 4 to 56.

Suitable pH-adjusting agents and buffering agents (C) and their effective amounts are known, for example, from the European patent application EP 1 036 836 A1, page 8, paragraphs [0080], [0085] and [0086], the international patent application WO 2005/014753 A1, page 12, lines 19 to 24, the American patent application US 2008/0254628 A1, page 6, paragraph [0073] or the American U.S. Pat. No. 7,300,601 B2, column 5, lines 33 to 63.

Suitable tantalum nitride enhancers (C) are low molecular carboxylic acids such as acetic acid, oxalic acid, and malonic acid, in particular malonic acid.

Suitable rheology agents (C) and their effective amounts are known, for example, from the American patent application US 2008/0254628 A1, page 5, paragraph [0065] to page 6, paragraph [0069].

Suitable surfactants (C) and their effective amounts are known, for example, from the international patent application WO 2005/014753 A1, page 8, line 23, to page 10, line 17 or from the American patent U.S. Pat. No. 7,300,601 B2, column 5, line 4 to column 6, line 8.

Suitable polyvalent metal ions (C) and their effective amounts are known, for example, from the European patent application EP 1 036 836 A1, page 8, paragraph [0076] to page 9, paragraph [0078].

Suitable organic solvents (C) and their effective amounts are known, for example, from the American patent U.S. Pat. No. 7,361,603 B2, column 7, lines 32 to 48 or the American patent application US 2008/0254628 A1, page 5, paragraph [0059].

Suitable materials (C) exhibiting a lower critical solution temperature LCST or an upper critical solution temperature UCST are described, for example, in the article of H. Mori, H. Iwaya, A. Nagai and T. Endo, Controlled synthesis of thermoresponsive polymers derived from L-proline via RAFT polymerization, in Chemical Communication, 2005, 4872-4874; or in the article of D. Schmaljohann, Thermo- and pH-responsive polymers and drug delivery, Advanced Drug Delivery Reviews, volume 58 (2006), 1655-1670 or in the American patent applications US 2002/0198328 A1, US 2004/0209095 A1, US 2004/0217009 A1, US 2006/0141254 A1, US 2007/0029198 A1, US 2007/0289875 A1, US 2008/0249210 A1, US 2008/0050435 A1 or US 2009/0013609 A1, the American patents U.S. Pat. No. 5,057,560, U.S. Pat. No. 5,788,82 and U.S. Pat. No. 6,682,642 B2, the international patent applications WO 01/60926 A1, WO2004/029160 A1, WO 2004/0521946 A1, WO 2006/093242 A2 or WO 2007/012763 A1, in the European patent applications EP 0 583 814 A1, EP 1 197 587 B1 and EP 1 942 179 A1, or the German patent application DE 26 10 705.

In principle, any known charge reversal agent (C) customarily used in the field of CMP can be used. Preferably, the charge reversal agent (C) is selected from the group consisting of monomeric, oligomeric and polymeric compounds containing at least one anionic group selected from the group consisting of carboxylate, sulfonate, sulfate and phosphonate groups.

Preferably, the pH of the composition of the invention is set between 8 and 12, preferably using the aforementioned pH-adjusting agents (C).

The preparation of the composition of the invention does not exhibit any particularities but can be carried out by dissolving or dispersing the above-described ingredients (A) and (B) and optionally (C) in an aqueous medium, in particular, deionized water. For this purpose, the customary and standard mixing processes and mixing apparatuses such as agitated vessels, in-line dissolvers, high shear impellers, ultrasonic mixers, homogenizer nozzles or counterflow mixers, can be used. Preferably, the composition of the invention thus obtained can be filtered through filters of the appropriate mesh aperture, in order to remove coarse-grained particles such as the agglomerates or aggregates of the solid, finely dispersed abrasive particles (A).

According to the use of the invention, the compositions of the invention are excellently suited for the manufacture of electrical, mechanical and optical devices wherein high precision polishing steps are required in the manufacturing process.

By way of example, electrical devices are IC devices, liquid crystal panels, organic electroluminescent panels, printed circuit boards, micro machines, DNA chips, micro plants and magnetic heads; the mechanical devices are high precision mechanical devices; and the optical devices are optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals, sapphire substrates for blue laser LEDs, semiconductor monocrystals, and glass substrates for magnetic disks.

Preferably, the IC devices, particularly the LSI and VLSI IC devices, contain structures with dimensions below 50 nm.

The compositions of the invention are most excellently suited for the process of the invention.

In the process of the invention, a substrate, in particular a semiconductor wafer, most particularly a silicon or silicon alloy semiconductor wafer such as a silicon germanium wafer, having patterned and unpatterned low-k dielectric layers having a dielectric constant of 3.5 or less is contacted at least once with an aqueous polishing composition comprising
(A) at least one type of abrasive particles as described hereinbefore and
(Ba) at least one amphiphilic nonionic surfactant selected from the group consisting of water-soluble or water-dispersible surfactants having
   (b1a) at least one hydrophobic group selected from the group consisting of linear alkyl groups having 5 to 20 carbon atoms and branched alkyl groups (b1) as described hereinbefore; and
   (b2) at least one hydrophilic group selected from the group consisting of polyoxyalkylene groups as described hereinbefore comprising oxyethylene monomer units (b21) and at least one type of substituted oxyalkylene monomer units (b22) in random, alternating, gradient and/or blocklike distribution.

With regard to the substrate having patterned and unpatterned low-k dielectric layers which is used in the above-mentioned process of the invention, the low-k dielectric layers have a dielectric constant of 3.5 or less, preferably 3.3 or less, most preferably 3.1 or less, most preferably 2.8 or less, for example 2.4 or less.

With regard to the substrate having patterned and unpatterned low-k dielectric layers which is used in the above-mentioned process of the invention, the low-k dielectric layers have a dielectric constant of preferably at least 0.01, more preferably at least 0.1, most preferably at least 0.3, for example at least 2.0.

Suitable linear alkyl groups (b1a) having 5 to 20 carbon atoms are derived from pentane, hexane, heptane, octane, nonane, decane, undecane, dodecane, tridecane, tetradecane, pentadecane, hexadecane, heptadecane, nonadecane and eicosane.

Thereafter, the substrate is chemically mechanically polished for a time and at a temperature sufficient to achieve the desired global and local planarity, whereafter the substrate is removed from the contact with the aqueous polishing composition.

The process on the invention exhibits its particular advantages in the CMP of silicon semiconductor wafers having patterned layers consisting of low-k or ultra-low-k silicon oxide dielectrics as isolating layers, silicon dioxide hard mask layers, tantalum nitride as stopping or barrier layers and electrically conductive copper wiring.

Suitable low-k or ultra-low-k dielectric materials and suitable methods of preparing the insulating dielectric layers are described in, for example, the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph [0024 or US 2008/0280452 A1, paragraphs [0024] to [0026], in the American patent U.S. Pat. No. 7,250,391 B2, column 1, lines 49 to 54, in the European patent application EP 1 306 415 A2, page 4, paragraph [0031] 4 in the European patent EP 1 534 795 B1, page 5, paragraph [0026].

Most preferably, carbon-doped silicon dioxide (CDO) is used as the low-k or ultra-low-k dielectric material. For example, BlackDiamond™ (from Applied Materials Inc.) is used as the low-k or ultra-low-k dielectric material. BlackDiamond™ (from Applied Materials Inc.) has a dielectric constant of about 3.0.

The process of the invention is particularly suited for the barrier CMP process which requires the selective removal of silicon dioxide without affecting the integrity of the low-k or ultra-low-k dielectric layer on a patterned semiconductor wafer. Therefore, in the process of the invention, a high selectivity of silicon dioxide or low-k over ultra-low-k dielectric material with regard to the MRRs is required. Preferably, the MRRs of tantalum nitride or tantalum/tantalum nitride layers and of copper layers are not affected when present.

It is a particular advantage of the process of the invention that it exhibits a selectivity of silicon dioxide over low-k or ultra-low-k dielectric material >3, preferably >5 with regard to the MRRs.

The process of the invention exhibits no particularities but can be carried out with the processes and the equipment customarily used for the CMP in the fabrication of semiconductor wafers with ICs.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the composition of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

By way of the process of the invention semiconductor wafers with ICs comprising patterned low-k and ultra-low-k material layers, in particular carbon-doped silicon dioxide layers, having an excellent planarity can be obtained. Therefore, copper damascene patterns can be obtained which also have an excellent planarity and, in the finished, IC an excellent electrical functionality.

EXAMPLES AND COMPARATIVE EXPERIMENTS

Examples 1 to 2 and Comparative Experiments C1 to C2

The Preparation of the CMP Slurries 1 to 2 (Examples 1 to 2) and C1 to C2 (Comparative Experiment C1 and C2) and Their Polishing Properties The CMP slurries 1, 2, C1 and C2 were prepared by dissolving and dispersing their components in ultra-pure water. The compositions of the CMP slurries are compiled in the Table 1.

TABLE 1

The Compositions of the CMP Slurries 1 to 2 (Examples 1 to 2) and C1 to C2 (Comparative Experiment C1 and C2)

| Example or Comparative Experiment No. | Silica abrasive[a] (% by weight) | Histidine (% by weight) | BTA[b] (% by weight) | Malonic Acid (% by weight) | Propylene Glycol (% by weight) | Amphiphilic Nonionic Surfactant (% by weight) | KOH (% by weight) |
|---|---|---|---|---|---|---|---|
| C1 | 4 | 0.0375 | 0.0289 | 0.648 | 0.642 | — | 1.925 |
| C2 | 4 | 0.0375 | 0.0289 | 0.648 | 0.642 | Triton™ DF16[c] 0.06 | 1.925 |
| 1 | 4 | 0.0375 | 0.0289 | 0.648 | 0.642 | A[d] 0.06 | 1.925 |
| 2 | 4 | 0.0375 | 0.0289 | 0.648 | 0.642 | B[e] 0.06 | 1.925 |

[a] average primary particle size d1: 35 nm; average secondary particle size d2: 70 nm; aggregate ratio d2/d1: 2; (FUSO™ PL-3 from Fuso Chemical Co.);
[b] benzotriazole;
[c] nonionic polyoxyethylene-polyoxypropylene alkyl ether surfactant from DOW, which is a mixture of molecules containing, on the average, one alkyl group having 8, 9 or 10 carbon atoms, and which is a linear alkyl polyoxyethylene-polyoxypropylene polymer as shown by 1H-NMR spectra;
[d] A = nonionic polyoxyethylene-polyoxybutylene alkyl ether surfactant which is a mixture of molecules containing, on the average, one branched alkyl group having 9, 10 or 11 carbon atoms and 7 oxyethylene monomer units and 1.5 oxybutylene monomer units in blocklike distribution;
[e] B = nonionic polyoxyethylene-polyoxypropylene alkyl ether surfactant which is a mixture of molecules containing, on the average, one branched alkyl group having 13, 14 or 15 carbon atoms and 16 oxyethylene monomer units and 4 oxypropylene monomer units in random distribution 4 kg of 31% by weight hydrogen peroxide was added to every 100 kg of each CMP slurry before polishing.

200 mm blanket silicon wafers having a TEOS layer of 15,000 Å (1500 nm) initial thickness, a copper layer of 15,000 Å (1500 nm) initial thickness, or tantalum nitride layer of 2000 Å (200 nm) initial thickness or an ultra-low-k carbon-doped silicon dioxide layer (Black Diamond™ BD1 of Applied Materials Inc.) of 10,000 Å (1000 nm) initial thickness were chemically mechanically polished with the CMP slurries 1, 2, C1 and C2 under the following conditions:

Polishing apparatus: AMAT Mirra (rotary type);
platen speed: 130 rpm;
carrier speed: 83 rpm;
polishing pad: Fujibo;
pad conditioning: in my situ
slurry flow rate: 200 ml/min;
conditioning downforce: 5 lbf (22.24 N);
number of dummy wafers: 4;
polishing downforce: 3 psi (205 mbar);
retaining ring pressure: 3 psi (205 mbar);
inner tube pressure: 2.5 psi (171 mbar)
polishing time: 60 seconds.

The MRRs were determined by weighing the wafers before and after polishing. The polishing results are compiled in the Table 2.

TABLE 2

The TEOS, Tantalum Nitride, Copper and Black Diamond ™ MRRs Obtained with the CMP Slurries 1, 2, C1 and C2

| CMP Slurry No. | TEOS MRR (Å/min) | Tantalum Nitride MRR (Å/min) | Copper MRR (Å/min) | Black Diamond ™ MRR (Å/min) | TEOS over Black Diamond ™ Selectivity | Tantalum nitride over Black Diamond ™ Selectivity | Copper over Black Diamond ™ Selectivity |
|---|---|---|---|---|---|---|---|
| C1 | 541 | 1100 | 436 | 586 | 0.92 | 1.87 | 0.747 |
| C2 | 543 | 1058 | 451 | 199 | 2.73 | 5.31 | 2.26 |
| 1 | 502 | 998 | 466 | 130 | 3.86 | 7.67 | 3.58 |
| 2 | 532 | 1067 | 377 | 94 | 5.66 | 11.35 | 4 |

The results of the Table 2 make apparent that the silicon dioxide, tantalum nitride and copper over ultra-low-k dielectric material selectivities could be significantly increased without negatively affecting the MRRs of silicon dioxide, tantalum nitride and copper. This is also corroborated by the significant drop of the ultra-low-k dielectric material MRR from 586 (comparative experiment C1) to 94 (example 2), i.e., a drop of about 84%. Therefore, the CMP slurries 1 to 2 of the examples 1 to 2 were excellently suited for the barrier CMP process.

We claim:

1. An aqueous polishing composition, comprising
(A) silica; and
(B) at least one amphiphilic nonionic surfactant selected from the group consisting of water-soluble or water-dispersible surfactants comprising
  (b1) at least one hydrophobic group selected from the group consisting of a branched alkyl group comprising 5 to 20 carbon atoms; and
  (b2) at least one hydrophilic group selected from the group consisting of a polyoxyalkylene group comprising
    (b21) an oxyethylene monomer unit and
    (b22) at least one substituted oxyalkylene monomer unit, wherein the substituents are selected from the group consisting of alkyl, cycloalkyl, aryl, alkyl-cycloalkyl, alkyl-aryl, cycloalkyl-aryl, and alkyl-cycloalkyl-aryl groups;
  wherein the polyoxyalkylene group comprises the monomer units (b21) and (b22) in random, alternating, gradient and/or block distribution, and wherein the pH of the composition is from 8 to 12.

2. The aqueous polishing composition of claim 1, wherein the hydrophobic group (b1) is selected from the group consisting of branched alkyl group comprising 8 to 15 carbon atoms.

3. The aqueous polishing composition of claim 1, wherein the oxyalkylene monomer unit (b22) is derived from a substituted oxirane, wherein the substituents are selected from the group consisting of alkyl, cycloalkyl, aryl, alkyl-cycloalkyl, alkyl-aryl, cycloalkyl-aryl, and alkyl-cycloalkyl-aryl groups.

4. The aqueous polishing composition of claim 3, wherein the substituents are selected from the group consisting of an alkyl group comprising 1 to 10 carbon atoms, a cycloalkyl group comprising 5 to 10 carbon atoms in spirocyclic, exocyclic and/or annealed configuration, an aryl group comprising 6 to 10 carbon atoms, an alkyl-cycloalkyl group comprising 6 to 20 carbon atoms, an alkyl-aryl group comprising 7 to 20 carbon atoms, a cycloalkyl-aryl group comprising 11 to 20 carbon atoms, and an alkyl-cycloalkyl-aryl group comprising 12 to 30 carbon atoms.

5. The aqueous polishing composition of claim 4, wherein the molar ratio of monomer units (b21) to monomer units (b22) is from 100:1 to 1:1.

6. The aqueous polishing composition of claim 1, wherein the polyoxyalkylene group has a degree of polymerization of from 5 to 100.

7. The aqueous polishing composition of claim 1, wherein the concentration of the surfactant (B) is from 1 ppm to 0.1% by weight, based on a complete weight of the composition.

8. The aqueous polishing composition of claim 1, further comprising at least one additional functional component (C), which is different from components (A) and (B).

9. A process for chemically mechanically polishing a substrate comprising patterned or unpatterned low-k or ultra-low-k dielectric layers having a dielectric constant of 3.5 or less, the process comprising:
(1) contacting the substrate material with an aqueous polishing composition comprising
  (A) silica; and
  (Ba) at least one amphiphilic nonionic surfactant selected from the group consisting of water-soluble or water-dispersible surfactants comprising
    (b1a) at least one hydrophobic group selected from the group consisting of a linear alkyl group comprising 5 to 20 carbon atoms and branched alkyl groups (b1); and (b2) at least one hydrophilic group selected from the group consisting of a polyoxyalkylene group comprising (b21) an oxyethylene monomer unit and (b22) at least one substituted oxyalkylene monomer unit, wherein the substituents are selected from the group consisting of alkyl, cycloalkyl, aryl, alkyl-cycloalkyl, alkyl-aryl, cycloalkyl-aryl and alkyl-cycloalkyl-aryl groups;

wherein the polyoxyalkylene group comprises the monomer units (b21) and (b22) in random, alternating, gradient and/or block distribution, and wherein the pH of the aqueous polishing composition is from 8 to 12;

(2) chemically mechanically polishing the substrate for a time and at a temperature sufficient to achieve the desired global planarity; and (3) removing the substrate from the contact with the aqueous polishing composition.

10. The process of claim 9, wherein the low-k and ultra-low-k dielectric layer material is selected from the group consisting of porous and non-porous organically modified silicon glasses and organic polymers.

11. The process of claim 10, wherein the organically modified silicon glass is carbon-doped silicon dioxide (CDO).

12. The process of claim 10, wherein the substrate further comprises at least one layer selected from the group consisting of a dielectric layer other than the low-k and ultra-low-k dielectric layer, a barrier layer, and a metal layer.

13. The process of claim 12, wherein the dielectric layer is a silicon dioxide layer.

14. The process of claim 13, having a silicon dioxide over low-k and ultra-low-k dielectric selectivity >3 with regard to the material removal rates (MRRs).

* * * * *